(12) United States Patent
Matsumoto

(10) Patent No.: US 6,606,336 B2
(45) Date of Patent: Aug. 12, 2003

(54) PHOTONIC SEMICONDUCTOR DEVICE

(75) Inventor: Keisuke Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 12 days.

(21) Appl. No.: 09/839,130

(22) Filed: Apr. 23, 2001

(65) Prior Publication Data
US 2002/0064201 A1 May 30, 2002

(30) Foreign Application Priority Data
Nov. 27, 2000 (JP) ........................................ 2000-359193

(51) Int. Cl.[7] ................................................. H01S 3/19
(52) U.S. Cl. ............................. 372/45; 372/46; 372/50
(58) Field of Search ........................... 372/43, 45, 46, 372/50

(56) References Cited

U.S. PATENT DOCUMENTS 5,288,659 A * 2/1994 Koch et al. .................... 375/45
6,198,863 B1 * 3/2001 Lealman et al. ............. 372/102
2001/0008539 A1 * 7/2001 Kudo ........................... 372/50

FOREIGN PATENT DOCUMENTS

JP 11-211924 8/1999

OTHER PUBLICATIONS

Bouda et al., "Compact High–Power Wavelength Selectrable Lasers For WDM Applications", Optical Fiber Communication Conference, Mar. 2000.

Young et al., "Six–Channel WDM Transmitter Module With Ultra–Low Chirp And Stable λ Selecton", Procedures of the 21st European Conference on Optical Communications, 1995, pp. 1019–1022.

* cited by examiner

Primary Examiner—Minh Loan Tran
(74) Attorney, Agent, or Firm—Leydig, Voit & Mayer, Ltd.

(57) ABSTRACT

A semiconductor laser device includes a combiner including a multi-mode interference wave-guide for connecting a laser unit with a light modulator of an output unit. The laser unit includes single wavelength semiconductor lasers, each laser producing a different wavelength. The lasers and the combiner are covered with and buried in a burying semiconductor layer having the same composition as that of current blocking structures in the laser unit

10 Claims, 17 Drawing Sheets

PRIOR ART

PRIOR ART

PRIOR ART

PRIOR ART

PRIOR ART

PHOTONIC SEMICONDUCTOR DEVICE

BACKGROUND OF THE INVENTION

1. Field of the Invention

The present invention relates to a photonic semiconductor device and a method for fabricating the device. More particularly, the invention relates to a semiconductor laser device for use with wavelength division multiplexing techniques for implementing optical communications, as well as to a method for fabricating the device.

2. Description of the Related Art

In recent years, wavelength division multiplexing (WDM) techniques have been drawing attention for their ability to boost capacities of data transmission over optical fibers. The use of WDM can appreciably multiply the capacity of an installed optical fiber to transmit data by a factor of dozens. Distributed feedback laser diodes (DFB-LD) used as light sources of WDM systems are required to keep their oscillation wavelengths at uniform intervals of, say, 0.4 or 0.8 nanometers (nm) within a wide wavelength range of, illustratively, between 10 and 50 nm. The requirement has been met conventionally by use of semiconductor laser units each acting as a light source corresponding to a specific oscillation wavelength. This practice has gotten costlier as a larger number of light sources is installed.

The growing cost of configured light sources is making it progressively unfeasible to have more and more wavelengths multiplexed. One solution to this problem is to utilize a wavelength tunable LD capable of producing many wavelengths by varying the electric current of a single chip. Another solution is the use of a plurality of LDs arrayed in a single integrated chip for dealing with numerous wavelengths. These light sources are generically referred to as multi-wavelength laser sources herein.

It is preferred that the multi-wavelength laser source be used not only as a light source of an actual system but also as a backup light source of WDM transmission equipment wherein numerous light sources are supported by a single chip. Such a setup if implemented is advantageous in terms of cost as it constitutes an inexpensive but highly reliable transmission system.

In that respect, inexpensive multi-wavelength laser sources for routing information to different locations on a network by varying laser output wavelengths (i.e., wavelength routing) are expected to play a major role in constructing a fully optical network in the future. Studies are underway, for multi-wavelength laser sources, on such devices as wavelength tunable LDs for addressing many wavelengths by varying the electric current value on a single chip, as well as a plurality of LDs arrayed into a single chip for dealing with numerous wavelengths, each device being integrated with light modulators.

Illustratively, authors of "Compact High-Power Wavelength Selectable Laser for WDM Applications" (Optical Fiber Communication Conference Technical Digest, Tull, Mar. 5–10, 2000, Baltimore, Md., U.S.A.) disclose a chip that integrates an eight-channel laser array with outputs of eight wavelengths arranged at intervals of 3.18 nm, a combiner for combining the multiple outputs into one output, and a semiconductor optical amplifier. The combiner for selecting one of the eight wavelengths in the chip is a 8×1 MMI (multi-mode interference) wave-guide combiner.

FIG. 12 is a perspective view of a conventional semiconductor laser device. In FIG. 12, reference numeral 200 stands for a semiconductor laser device; 202 for a laser unit; 204 for a combiner unit; 206 for an output unit; 208 for a laser array; 210 for electrodes of the laser array 208; 212 for a 4×1 MMI combiner; 214 for an electro-absorption modulator (EAM); 216 for electrodes of the EAM 214; and 218 for an InP burial layer.

A typical method for fabricating the conventional semiconductor laser device is outlined below. FIG. 13 is a perspective view of the conventional laser device in one process of its fabrication. FIG. 14 is a perspective view for schematically explaining how the conventional semiconductor laser device can develop a defect attributable to the method for fabricating that device.

In FIG. 13, an n-InP clad layer 222 (n-conductivity type is referred to as "n-" hereunder), a laser active layer 224, and a p-InP clad layer 226 (p-conductivity type is referred to as "p-" hereunder) are formed on an InP substrate 220. From the substrate 220, portions except for the laser unit 202 are then removed. Over the substrate regions cleared of their layer elements, an n-InP clad layer 228, an optical wave-guide layer 230 and a p-clad layer 232 are formed. During the process, a diffraction grating layer (not shown) is formed within the n-InP clad layer 222 or p-InP clad layer 226 of the laser unit 202.

An insulating film is then formed over the layered structure. A mask pattern 234 is prepared through which to form the laser unit 202 as a band-shaped laser array 1 to 2 μm wide, the MMI combiner 212 as a rectangle 5 to 50 μm wide and 20 to 500 μm long in the direction of a resonator, and the light modulator as a band shape 1 to 2 μm wide. Etching is carried out using the mask pattern 234 as a mask until the laser active layer 224 of the laser unit 202 or the optical wave-guide layer 230 is etched through or until the substrate 220 is exposed, whereby a ridge structure is formed. FIG. 13 shows the outcome of the processing. Later, a buried growth process is performed on the InP burial layer 218 using the mask pattern 234 as a mask for selective growth.

The contact electrodes 210 are then formed on the laser unit 202, and a contact electrode 216 is furnished to the EAM 214 of the output unit 206. A back surface of the substrate 220 is polished to a thickness of 100 μm to form back surface electrodes. This completes the semiconductor laser device 200 illustrated in FIG. 12.

One disadvantage of the above process of fabricating the semiconductor laser device 200 is this: because of an extensive top surface of the MMI combiner 212, the buried growth process by use of the selective growth mask can leave InP polycrystals 238 grown over the insulating film on the wave-guide of the MMI combiner 212 as shown in FIG. 14. The polycrystals thus grown can result in broken resist films or related irregularities in subsequent processes.

FIG. 15 is a perspective view of another conventional semiconductor laser device. In FIG. 15, reference numeral 240 stands for a semiconductor laser device and 242 for branching wave-guides. The semiconductor laser device 240 utilizes the branching wave-guides 242 in place of an MMI combiner 212.

FIG. 16 is a perspective view of the conventional laser device of FIG. 15 in one process of its fabrication. FIG. 17 is a perspective view for schematically explaining how the conventional semiconductor laser device can develop a defect attributable to the method for fabricating that device.

The method for fabricating the semiconductor laser device 240 is the same as the method for producing the semiconductor laser device 200 in forming the layered structure of the laser unit 202, combiner 204 and output unit 206.

An insulating film is then formed over the layered structure. A mask pattern 244 is prepared through which to form the laser unit 202 as a band-shaped laser array 1 to 2 μm wide, the branching wave-guides 242 to a width of 1 to 2 μm each connected to the laser unit array, and the light modulator as a band shape 1 to 2 μm wide. Etching is carried out using the mask pattern 244 as a mask until the active layer of the laser unit 202 or wave-guide layers of other regions are etched through, whereby a ridge structure is formed. FIG. 16 shows the outcome of the processing.

Later, a buried growth process is performed on the InP burial layer 218 using the mask pattern 244 as a mask for selective growth.

Contact electrodes 210 are then formed on the laser unit 202, and a contact electrode 216 is furnished to the EAM 214 of the output unit 206. A back surface of the substrate 220 is polished to a thickness of 100 μm to form back surface electrodes. This completes the semiconductor laser device 240 shown in FIG. 15.

A disadvantage of the above process of fabricating the semiconductor laser device 240 is this: when the buried growth process is carried out on the InP burial layer 218 to form the branching wave-guides 242 in the laser unit 202 and output unit 206, bases of the branches can develop projections 246 through abnormal growth, as shown in FIG. 17. The projections 246 can result in broken resist films or related irregularities in subsequent processes.

The buried growth process of the combiner portion, when performed conventionally, can entail formation of polycrystals 238 or projections 246 through abnormal growth as described above. The defect leads to faulty processes that can end up lowering the yields of the photonic semiconductor device or degrading its reliability.

Publications related to this invention include Japanese Published Unexamined Patent Application No. Hei 11-211924. The publication discloses a silicon substrate arrangement carrying: a plurality of cores for propagating light emitted by a plurality of single longitudinal mode semiconductor chips incorporating electro-absorption semiconductor light modulators; a multi-mode interference wave-guide combiner; and at least one output crystal optical wave-guide. The disclosure, however, makes no reference to a buried structure of the multi-mode interference optical combiner.

SUMMARY OF THE INVENTION

The present invention has been made in view of the above circumstances, and a first object of the invention is therefore to overcome the above and other deficiencies of the prior art and to provide a highly reliable photonic semiconductor device that is fabricated with high yield rates.

According to one aspect of the invention, there is provided a photonic semiconductor device comprising: a laser unit made of a plurality of single wavelength semiconductor lasers each of which has a different wavelength and comprises a pair of current block structures sandwiching from both sides an optical wave-guide ridge including an active layer; an output unit having a first wave-guide layer sandwiched from above and below by a first upper clad layer and a first lower clad layer, and outputting a laser emission coming from the laser unit; a combiner unit having a second wave-guide layer sandwiched from above and below by a second upper clad layer and a second lower clad layer, and having one end connected to the laser unit and the opposite end connected to the output unit; a semiconductor substrate for carrying the laser unit, the output unit and the combiner unit; and a burial semiconductor layer of a material composition identical to that of the current block structures of the laser unit, which is disposed on the semiconductor substrate, and which covers and buries the combiner unit.

Accordingly, the inventive structure constitutes a highly reliable photonic semiconductor device fabricated at low costs with high yield rates.

Another object of the invention is to provide a method for fabricating a highly reliable photonic semiconductor device with high yield rates.

According to another aspect of the invention, there is provided a photonic semiconductor device fabricating method comprising the steps of: performing a first process wherein a semiconductor layer for a semiconductor laser unit is first deposited on a semiconductor substrate; a semiconductor laser layer which is a part of the semiconductor layer is then left on the substrate by removing the rest of the semiconductor layer; a combiner unit layer having a second wave-guide layer sandwiched from above and below by a second upper clad layer and a second lower clad layer is formed connecting to the semiconductor laser layer; and an output unit layer having a first wave-guide layer sandwiched from above and below by a first upper clad layer and a first lower clad layer is formed connecting to the combiner unit layer; performing a second process wherein a dielectric film is formed over surfaces of the semiconductor laser layer, the combiner unit layer, and the output unit layer; photolithographic and etching techniques are used to form a plurality of stripe-shaped mask patterns on the semiconductor laser layer, a prescribed mask pattern on the combiner unit layer, and a stripe-shaped mask pattern on the output unit layer; and etching is carried out using the mask patterns as masks so as to form a plurality of optical wave-guide ridges of the semiconductor laser unit, a combiner unit, and an output unit ridge; and performing a third process wherein the dielectric film is removed from the combiner unit so as to have a mask pattern formed by the remaining dielectric film; and the mask pattern is used as a selective growth mask through which the combiner unit is covered with and buried by a semiconductor layer constituting current block structures of the semiconductor laser unit.

Accordingly, in forming the combiner unit by buried growth, this fabricating method prevents polycrystals or like abnormal projections from growing so that subsequent processes are carried out with no trouble. The inventive method thus makes it possible to fabricate a highly reliable photonic semiconductor device in simplified steps with high yield rates.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the same elements are given the same reference number.

DESCRIPTION OF THE PREFERRED EMBODIMENT

First Embodiment

Figure 1:
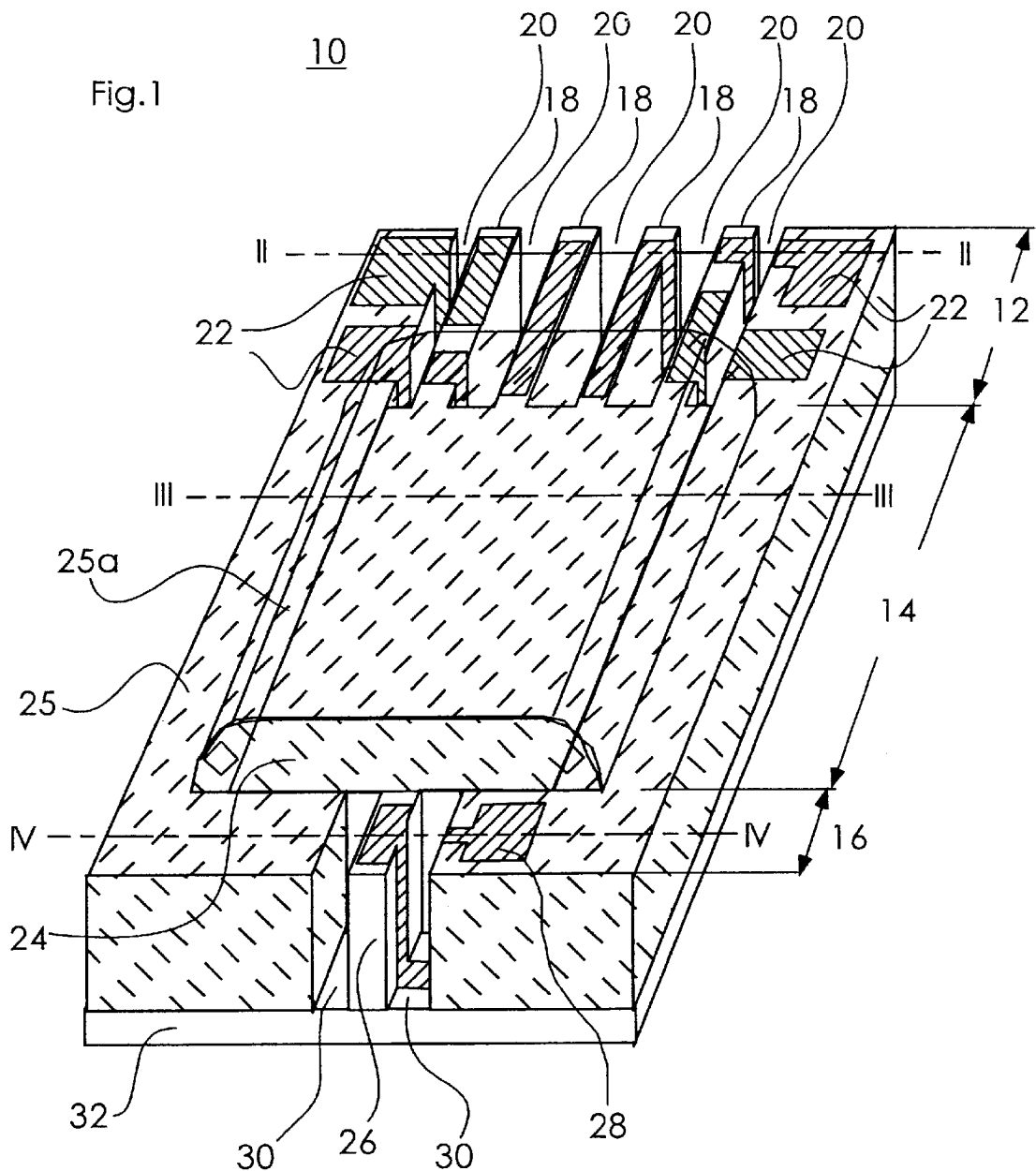
FIG. 1 is a partially see-through perspective view of a semiconductor laser device practiced as a first embodiment of the invention.

A photonic semiconductor device practiced as the first embodiment of this invention comprises: a laser unit made of a plurality of single wavelength semiconductor lasers having a different wavelength each; a light modulator of an output unit; and a combiner unit that has a multi-mode interference wave-guide for connecting the laser unit with the light modulator. All components are covered with a burial semiconductor layer of the same material as that of a current block structure of the laser unit, with the combiner unit buried in the layer. FIG. 1 is a partially see-through perspective view of a semiconductor laser device practiced as the first embodiment of the invention.

In FIG. 1, reference numeral 10 stands for a wavelength division multiplexing semiconductor laser device; 12 for a laser unit; 14 for a combiner unit; 16 for an output unit; and 18 for a plurality of single-wavelength DFB-LDs having a different oscillation wavelength each. Although four DFB-LDs 18 are shown in FIG. 1, this is not limitative of the invention; the DFB-LDs may constitute a laser array having oscillation wavelengths arranged at intervals of, say, 0.4 or 0.8 nm in a wide wavelength range of between 10 and 50 nm. Reference numeral 20 denotes grooves that isolate the DFB-LDs 18, and numeral 22 represents electrodes of the DFB-LDs 18.

In the first embodiment, the combiner unit 14 is constituted by an MMI combiner 24 shaped rectangularly as viewed from above. Reference numeral 25 denotes a burial semiconductor layer that buries and covers the MMI combiner 24, and numeral 25a stands for a mound-shaped portion covering the combiner unit 14. The mound-shaped portion 25a is shown in see-through fashion in FIG. 1.

The output unit 16 in the first embodiment is made of an EAM 26. Alternatively, the output unit 16 may be constituted either by an optical amplifier (SOA) alone or by both EAM 26 and SOA. Reference numeral 28 stands for an electrode of the EAM 26, and numeral 30 for grooves that isolate the EAM 26.

Although not shown in FIG. 1, an insulating film 27 such as an SiO2 film covers surfaces of the laser unit 12, burial semiconductor layer 25 of the combiner unit 14, and output unit 16. The DFB-LDs 18 and EAM 26 are each topped with an opening 29 (not shown in FIG. 1) to provide conductance between the electrodes 22 and 28 on the one hand and the layers underneath on the other hand. Reference numeral 32 represents an n-InP substrate.

Figure 2:
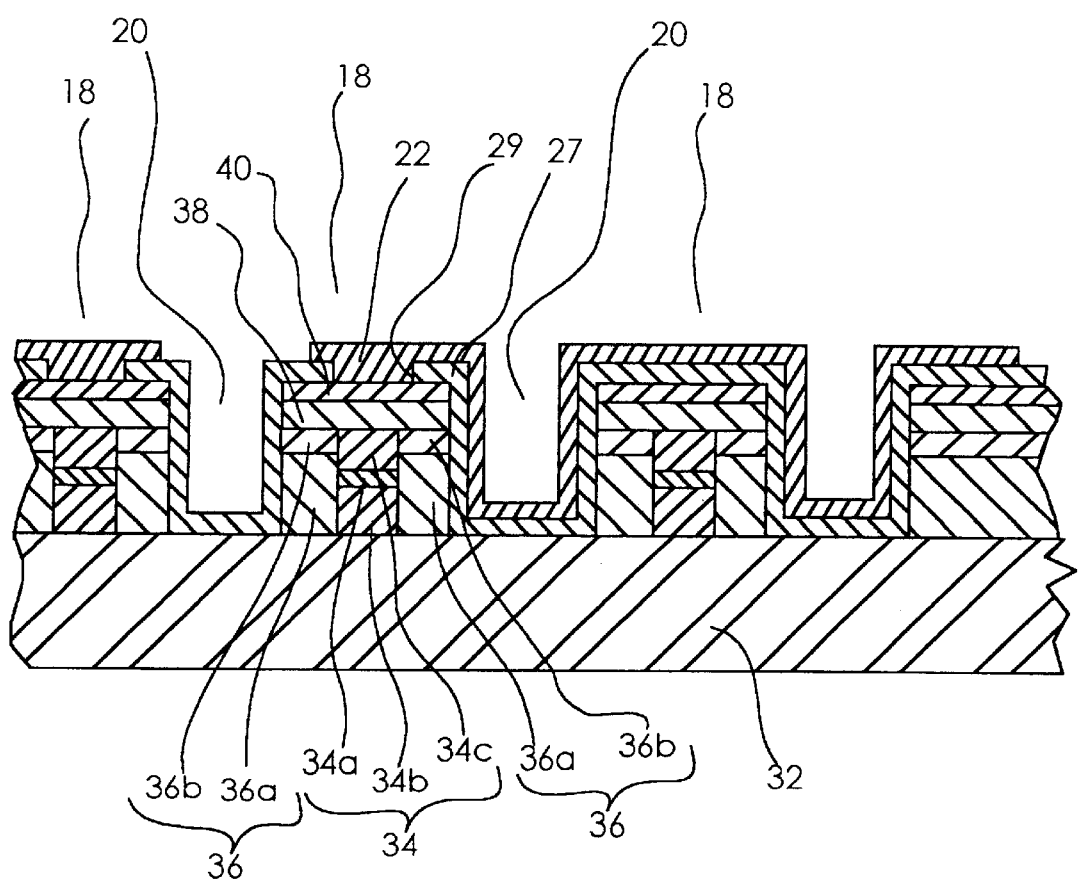
FIG. 2 is a cross-sectional view of the inventive semiconductor laser device as the first embodiment.

FIG. 2 is a cross-sectional view taken on line II—II of the laser unit 12 in the semiconductor laser device 10. In FIG. 2, each DFB-LD 18 comprises a laser wave-guide ridge 34 having a lower n-InP clad layer 34b and an upper p-InP clad layer 34c sandwiching an MQW active layer 34a with a band-gap wavelength ($\lambda$ g) of 1.55 $\mu$m on the substrate 32. Also in the DFB-LD 18 are a pair of current block structures 36 each having an Fe-doped InP burial layer 36a and an n-InP current block layer 36b deposited on the substrate 32 in that order. The paired current block structures 36 are formed in a manner sandwiching the laser wave-guide ridge 34 from both sides on the substrate 32.

Above the laser wave-guide ridge 34 and current block structures 36 are a second p-InP clad layer 38 and a p-InGaAs contact layer 40 that is a heavily-doped semiconductor layer. The layers 38 and 40 are isolated by the grooves 20 within each of the single-wavelength DFB-LDs 18 having different oscillation wavelengths. The insulating film 27 such as an SiO2 film is provided over the surface and has the openings 29 formed therethrough to permit conductance between the p-InGaAs contact layer 40 and the electrodes 22.

Figure 3:
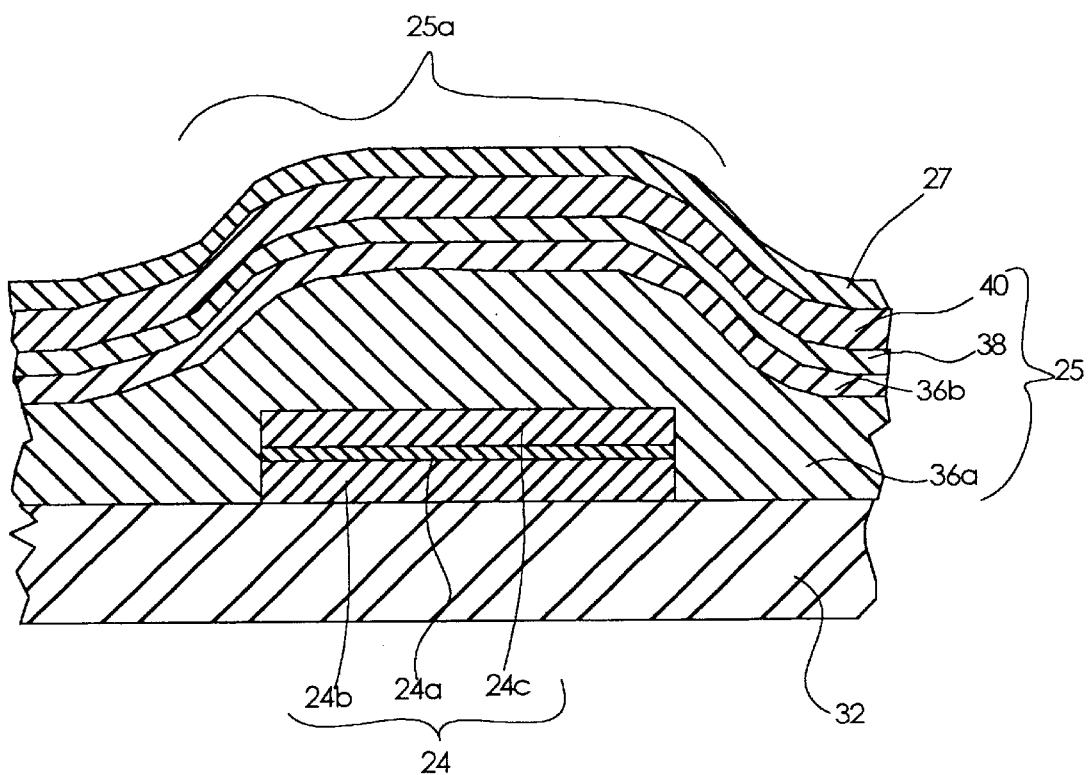
FIG. 3 is another cross-sectional view of the first embodiment.

FIG. 3 is a cross-sectional view taken on line III—III of the combiner unit 14 in the semiconductor laser device 10. In FIG. 3, the MMI combiner 24 shaped rectangularly as viewed from above is formed on the substrate 32. The MMI combiner 24 has a layered structure in which a combiner wave-guide layer 24a acting as a second wave-guide layer with a band-gap wavelength ($\lambda$ g) of 1.3 $\mu$m is sandwiched from below and above by an n-InP lower clad layer 24b (second lower clad layer) and a p-InP upper clad layer 24c (second upper clad layer). The rectangle shape has a width of several laser elements, i.e., the width of the DFB-LDs 18 supplemented by that of isolation grooves, and is as long as a resonator. Illustratively, the MMI combiner 24 constitutes a rectangle 5 to 50 $\mu$m wide and 20 to 500 $\mu$m long in the resonator direction. Arranged in the wave-guide direction, a plurality of DFB-LDs 18 are connected to one plane edge of the MMI combiner 24. The opposite edge of the MMI combiner 24 is connected with the EAM 26 of the output unit 16.

The MMI combiner 24 is covered with and buried in the burial semiconductor layer 25 that comprises the Fe-doped InP burial layer 36a, n-InP current block layer 36b, second p-InP clad layer 38, and p-InGaAs contact layer 40.

The Fe-doped InP burial layer 36a and n-InP current block layer 36b constitute the same layered structure as that of the current block structures 36 of the DFB-LDs 18. The second p-InP clad layer 38 and p-InGaAs contact layer 40 are not required as part of the burial semiconductor layer 25. The insulating film 27 covers the burial semiconductor layer 25.

Figure 4:
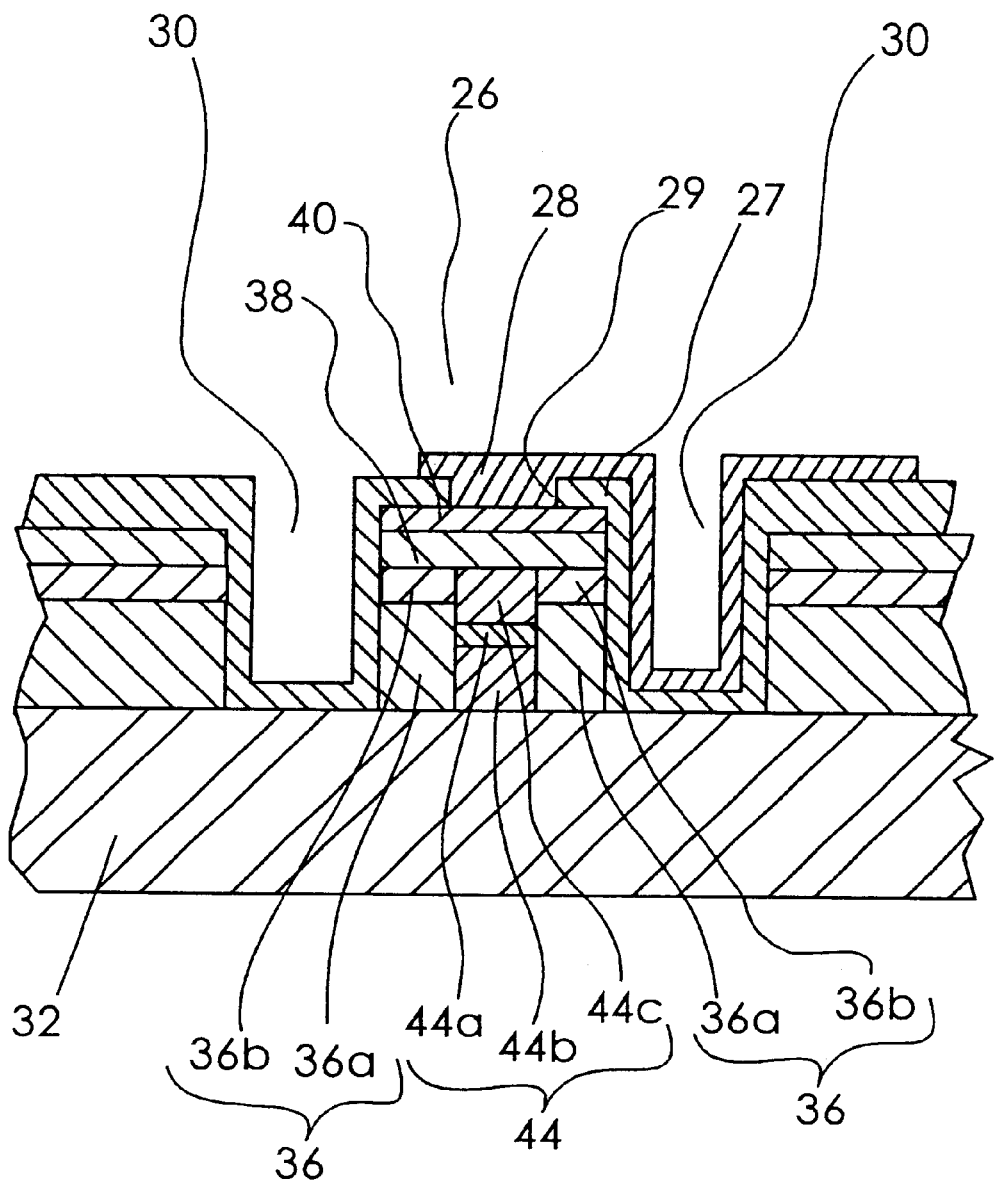
FIG. 4 is another cross-sectional view of the first embodiment.

FIG. 4 is a cross-sectional view taken on line IV—IV of the output unit 16 in the semiconductor laser device 10. In FIG. 4, the EAM 26 of the output unit 16 comprises a light modulator wave-guide ridge 44 that has an n-InP lower clad layer 44b (first lower clad layer) and a p-InP upper clad layer 44c (first upper clad layer) sandwiching a light absorption layer 44a with a bandgap wavelength ($\lambda$ g) of 1.4 to 1.5 $\mu$m on the surface of the substrate 32. A pair of current block structures 36 are formed in a manner sandwiching the light modulator wave-guide ridge 44 from both sides on the substrate 32, each structure having the Fe-doped InP burial layer 36a and n-InP current block layer 36b deposited on the substrate surface in that order.

The second p-InP clad layer 38 and the p-InGaAs contact layer 40 (a heavily-doped semiconductor layer) are deposited on the light modulator wave-guide ridge 44 and current block structures 36. The light modulator ridge 44 is isolated by the isolation grooves 30. The insulating film 27 such as an SiO2 film is formed over the surface and has the opening 29 formed therethrough to permit conductance between the p-InGaAs contact layer 40 and the electrode 28.

Figure 5:
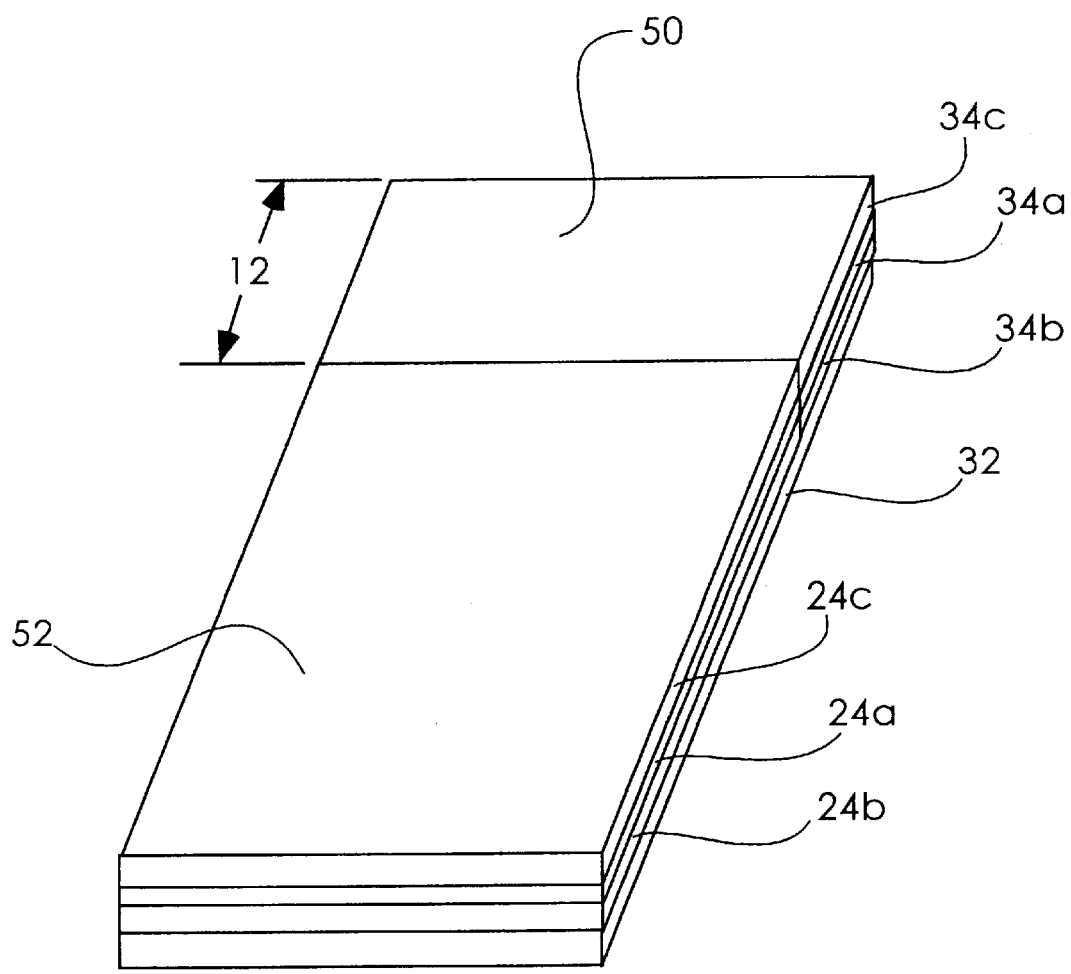
FIG. 5 is a perspective view of the first embodiment in one fabricating process.
Figure 6:
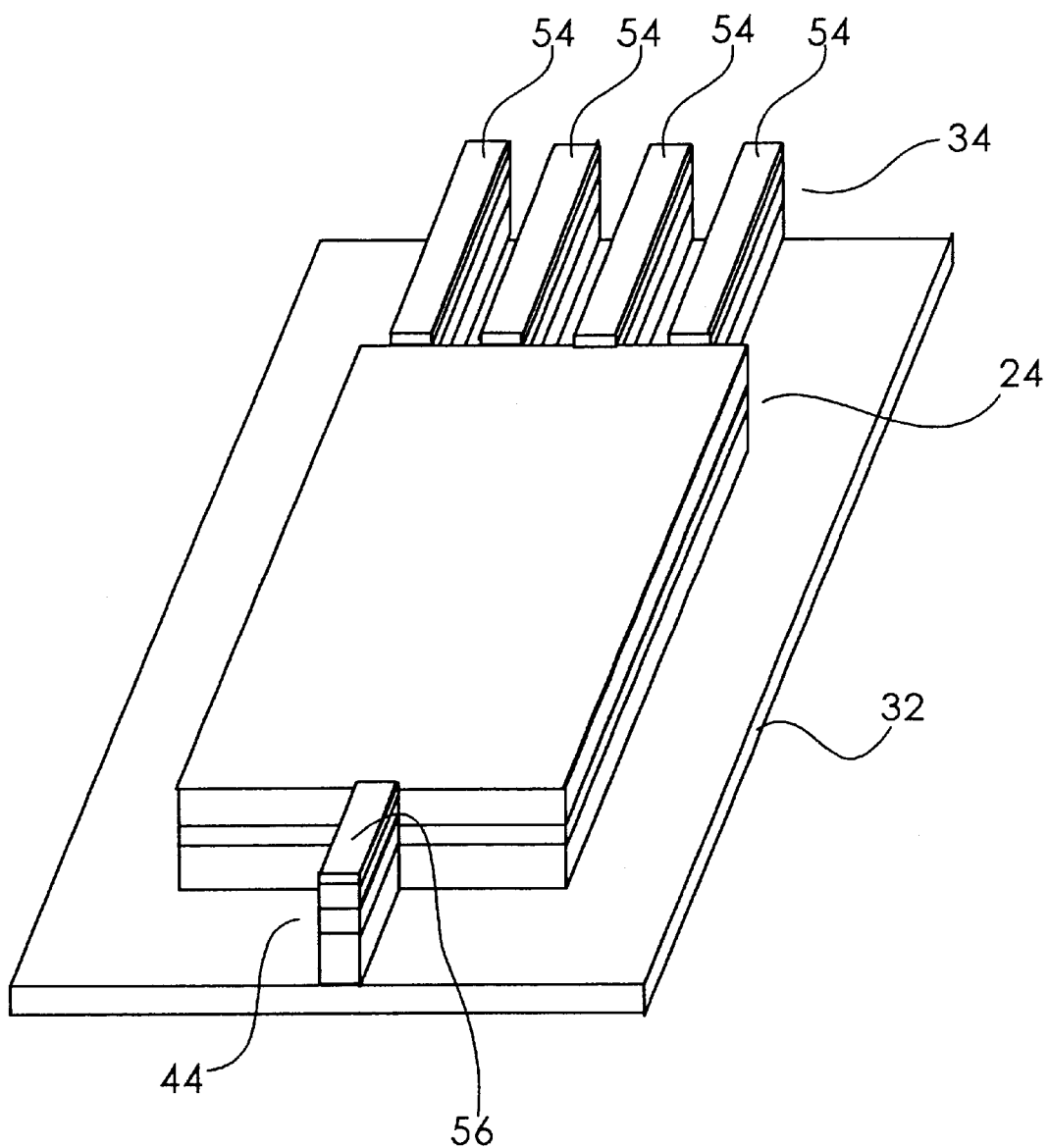
FIG. 6 is a perspective view of the first embodiment in another fabricating process.
Figure 7:
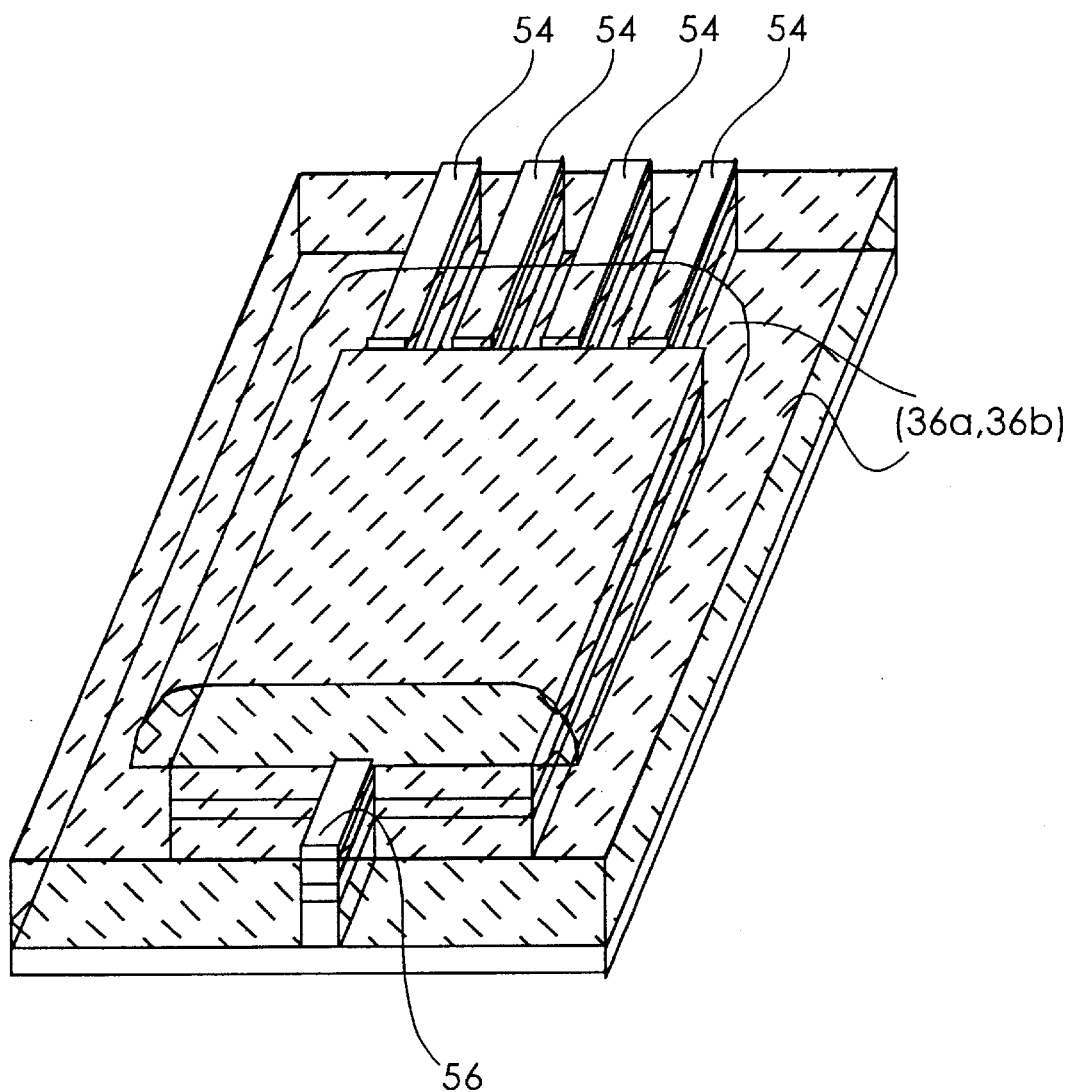
FIG. 7 is a partially see-through perspective view of the first embodiment in another fabricating process.

An inventive method for fabricating the semiconductor laser device 10 will now be described. FIGS. 5, 6 and 7 are perspective views of the semiconductor laser device 10 in different processes of its fabrication.

In FIG. 5, an n-InP clad layer 34b, a laser active layer 34a, and a p-InP clad layer 34c are formed on the n-InP substrate 32. From the substrate 32, portions except for a layer 50 of the laser unit 12 are then removed. Over the substrate regions cleared of their layer elements, a layer 52 having an n-InP clad layer 24b, an optical wave-guide layer 24a and a p-clad layer 24c is formed.

During the process, a diffraction grating layer (not shown) is formed within the n-InP clad layer 34b or p-InP clad layer 34c of the layer 50 of the laser unit 12. FIG. 5 shows the outcome of the process.

This fabricating method has been shown forming by the same material the n-InP clad layer 24b, optical wave-guide layer 24a and p-clad layer 24c of the combiner unit 14; the n-InP lower clad layer 44b and light absorption layer 44a of the output unit 16; and the p-InP first upper clad layer 44c. Alternatively, the n-InP clad layer 24b, optical wave-guide layer 24a and p-clad layer 24c of the combiner unit 14; the n-InP lower clad layer 44b and light absorption layer 44a of the output unit 16; and the p-InP first upper clad layer 44c may be formed as needed by different materials.

An insulating film is then formed over the layered structure. A mask pattern is prepared through which to form the laser unit 12 as a band-shaped laser array 1 to 2 $\mu$m wide, the combiner unit 14 as a rectangle 5 to 50 $\mu$m wide and 20 to 500 $\mu$m long in the direction of a resonator, and the output unit 16 as a band shape 1 to 2 $\mu$m wide. Etching is carried out using this mask pattern as a mask until the laser active layer, the optical wave-guide layer 24a of the combiner unit 14, and the light absorption layer 44a of the output unit 16 are etched through. The process forms a ridge structure comprising the laser wave-guide ridge 34 of the laser unit 12, MMI combiner unit 24, and the light modulator wave-guide ridge 44 of the output unit 16.

Later, the insulating film is removed from above the combiner unit 14 but insulating films 54 and 56 are left intact on the laser unit 12 and output unit 16 respectively. FIG. 6 shows the outcome of the process.

A buried growth process is then performed using the insulating film 54 on the laser unit 12 and the insulating film 56 on the output unit 16 as a mask for selective growth. Specifically, the laser wave-guide ridge 34, MMI combiner unit 24, and light modulator wave-guide ridge 44 are subjected to buried growth using the insulating films 54 and 56 as the selective growth mask with the Fe-doped InP burial layer 36a and n-InP current block layer 36b deposited the substrate surface in that order. FIG. 7 shows the outcome of the process.

The insulating films 54 and 56 are removed from the laser unit 12 and output unit 16 respectively. The second p-InP clad layer 38 and p-InGaAs contact layer 40 are formed all over the substrate 32. The isolation grooves 20 are formed on both sides of the laser wave-guide ridge 34 and the isolation grooves 30 on both sides of the light modulator wave-guide ridge 44. The insulating film 27 such as an SiO2 film is deposited all over the substrate 32. After openings are made through the insulating film 27 on the laser wave-guide ridge 34 and light modulator wave-guide ridge 44, the electrodes 22 and 28 are formed. A back surface of the substrate 32 is then polished to a thickness of about 100 $\mu$m to form back surface electrodes. This completes the semiconductor laser device 10 shown in FIG. 1.

When the laser wave-guide ridge 34, MMI combiner unit 24 and light modulator wave-guide ridge 44 are subjected to buried growth during fabrication of the semiconductor laser device 10, the Fe-doped InP burial layer 36a and n-InP current block layer 36b are deposited on the MMI combiner unit 24 because the latter has no selective growth mask. Unlike in the conventional example, however, no polycrystals grow on the MMI combiner 24. The absence of abnormally grown polycrystals means no broken resist films or related irregularities in subsequent processes.

Although the second p-InP clad layer 38 and contact layer 40 are not required as part of the burial semiconductor layer 25, they are left intact following the processing. Because the contact layer 40 has a high impurity density, the interposing presence of the Fe-doped InP burial layer 36a between the contact layer 40 and the MMI combiner 24 prevents p-type Zn impurities from diffusing from the contact layer 40 into the combiner wave-guide layer 24a, whereby the transmission loss is reduced.

Following the formation of the second p-InP clad layer 38 and p-InGaAs contact layer 40, the mound-shaped portion 25a of the burial semiconductor layer 25 is left intact on the MMI combiner 24. However, this does not cause any trouble because no electrodes are formed in the region.

As described, the processes above fabricate the semiconductor laser device 10 at low costs with high yields. Because no unstable phases are involved in its processing, the inventive method permits fabrication of a highly reliable semiconductor laser device. Furthermore, in utilizing the etching mask as a selective growth mask for crystal growth, the inventive semiconductor laser device fabricating method simply removes the insulating film from the region over the MMI combiner 24 and thereby enhances the yield of the device.

Second Embodiment

A second embodiment of this invention is constituted by having a combiner unit buried in and covered with a burial semiconductor layer, the combiner unit including branching wave-guides that connect a plurality of single wavelength semiconductor lasers each having a different oscillation wavelength to a light modulator of an output unit. The burial semiconductor layer is formed by the same material as that of current block structures in a laser unit.

Figure 8:
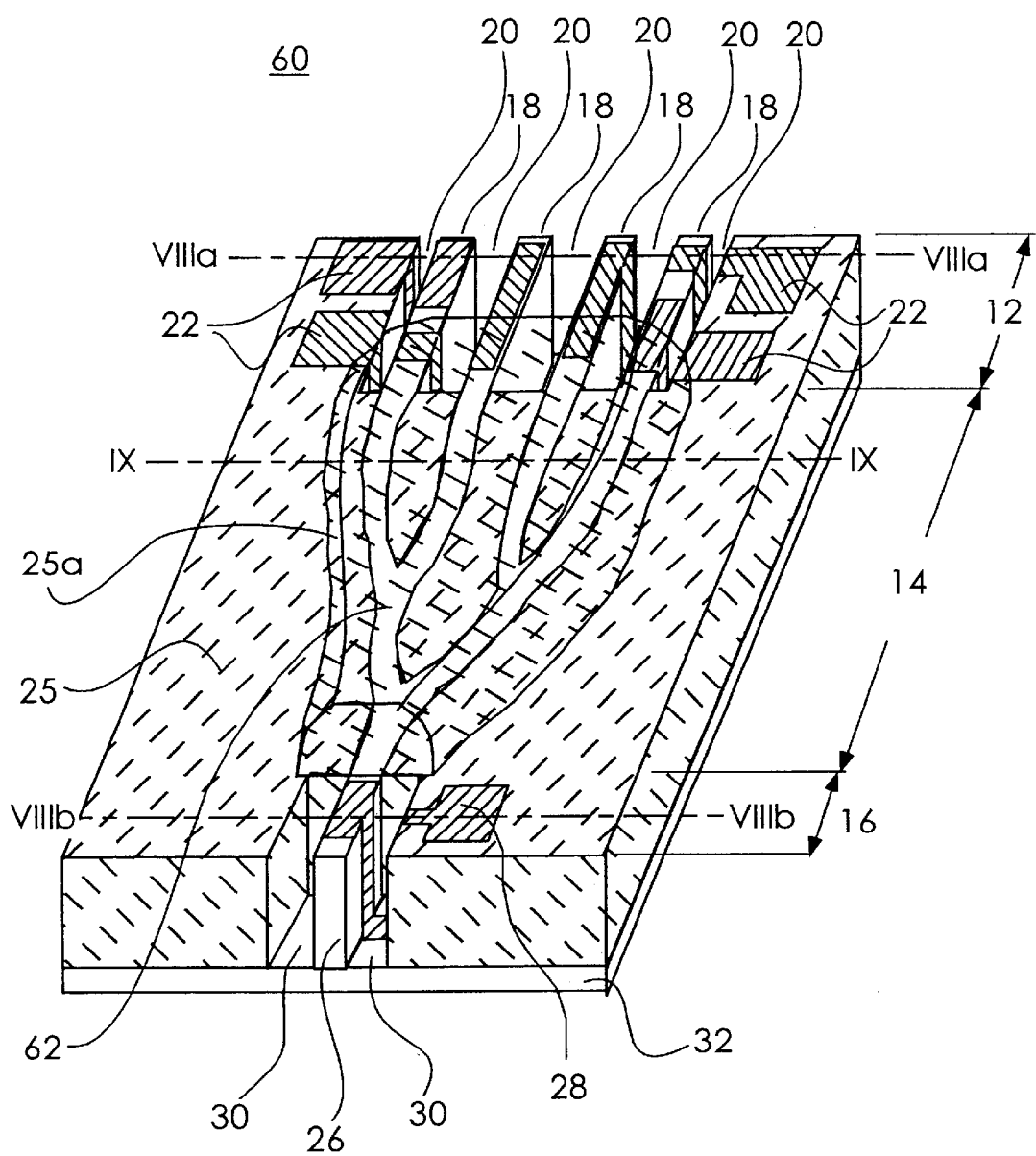
FIG. 8 is a partially see-through perspective view of another semiconductor laser device practiced as a second embodiment of the invention.

FIG. 8 is a partially see-through perspective view of a semiconductor laser device practiced as the second embodiment of this invention. In FIG. 8, reference numeral 60 stands for a wavelength division multiplexing semiconductor laser device. In the second embodiment, the combiner unit 14 is formed by branching wave-guides 62.

Each of the branching wave-guides 62 is part of a Y-branch 1 to 2 μm wide. Single wavelength semiconductor lasers 18 are matched with as many Y-branch ends of the wave-guides at one edge of the device. The Y-branches combine with one another in such a manner that as they progress toward the opposite edge of the device, the branches drop in number and eventually converge on a single Y-branch. On one device edge, the ends of the Y-branches are connected to the single wavelength semiconductor lasers 18 each having a different oscillation wavelength. On the opposite device edge, the end of the single Y-branch is connected to an EAM 26 as the output unit of the second embodiment. As with the first embodiment, the output unit may be connected either to an optical amplifier (SOA) alone or to both EAM 26 and SOA.

Reference numeral 25a stands for a mound-shaped portion of the burial semiconductor layer 25 covering the combiner unit 14. The mound-shaped portion 25a is shown in see-through fashion in FIG. 8.

The DFB-LDs 18 of the laser unit 12 and EAM 26 of the output unit are structurally the same as those in the first embodiment. For the first and the second embodiment, like reference numerals designate like or corresponding parts.

Figure 9:
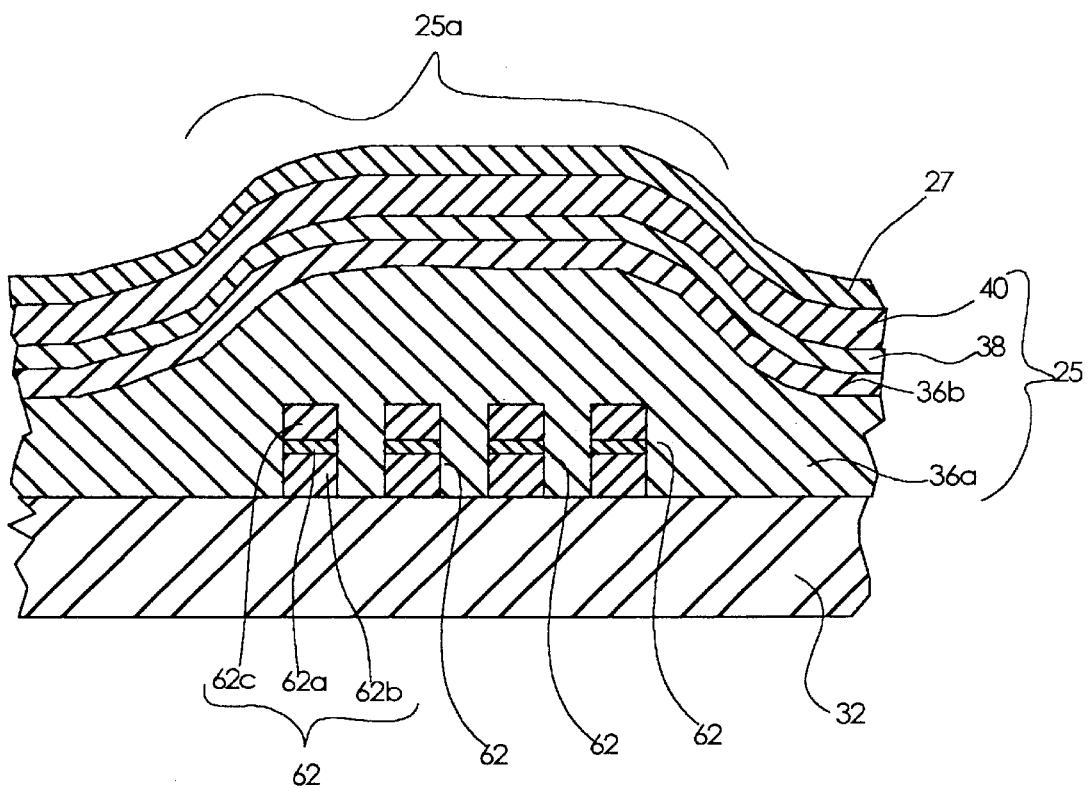
FIG. 9 is a cross-sectional view of the inventive semiconductor laser device as the second embodiment.

FIG. 9 is a cross-sectional view taken on line IX—IX of the combiner part 14 in the semiconductor laser device 60. In FIG. 9, the branching wave-guides 62 constitute a layered structure in which a combiner wave-guide layer 62a acting as a second wave-guide layer with a band-gap wavelength ($\lambda$ g) of 1.3 μm is sandwiched from below and above by an n-InP lower clad layer 62b (second lower clad layer) and a p-InP upper clad layer 62c (second upper clad layer).

The branching wave-guides 62 are covered with and buried in the burial semiconductor layer 25 that comprises an Fe-doped InP burial layer 36a, an n-InP current block layer 36b, a second p-InP clad layer 38, and a p-InGaAs contact layer 40. The Fe-doped InP burial layer 36a and n-InP current block layer 36b constitute the same layered structure as that of the current block structures 36 of the DFB-LDs 18. The second p-InP clad layer 38 and contact layer 40 are not required as part of the burial semiconductor layer 25. An insulating film 27 covers the burial semiconductor layer 25.

In the second embodiment, the mound-shaped portion 25a of the burial semiconductor layer 25 covers the branching wave-guides 62 of the combiner unit 14 as well. The mound-shaped portion 25a is shown in see-through fashion in FIG. 8. A cross-sectional view taken on line VIIIa—VIIIa of the semiconductor laser device 60 in FIG. 8 is the same as that of FIG. 2, and a cross-sectional view taken on line VIIIb—VIIIb in FIG. 8 is the same as that of FIG. 4.

Figure 10:
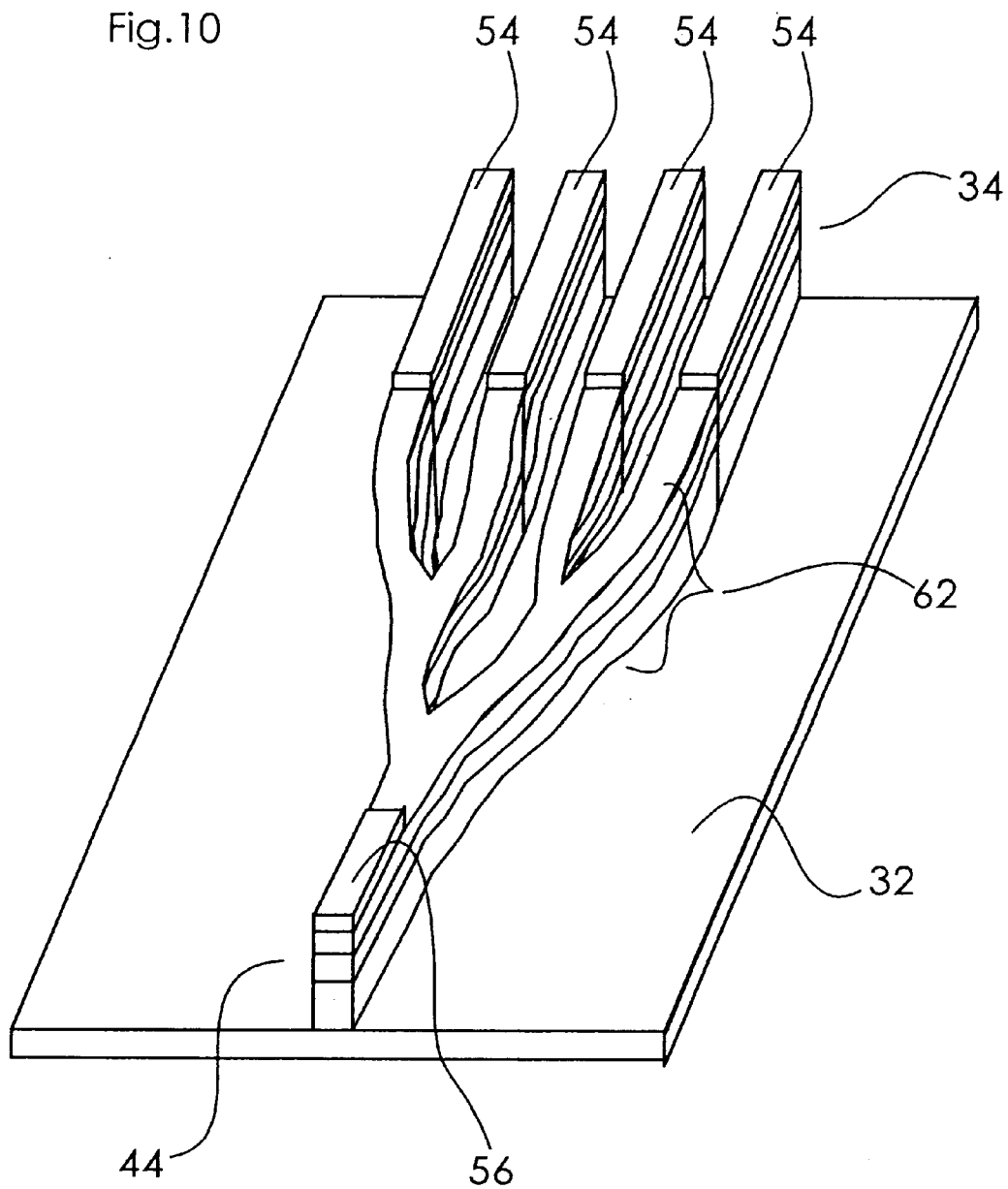
FIG. 10 is a perspective view of the second embodiment in one fabricating process.
Figure 11:
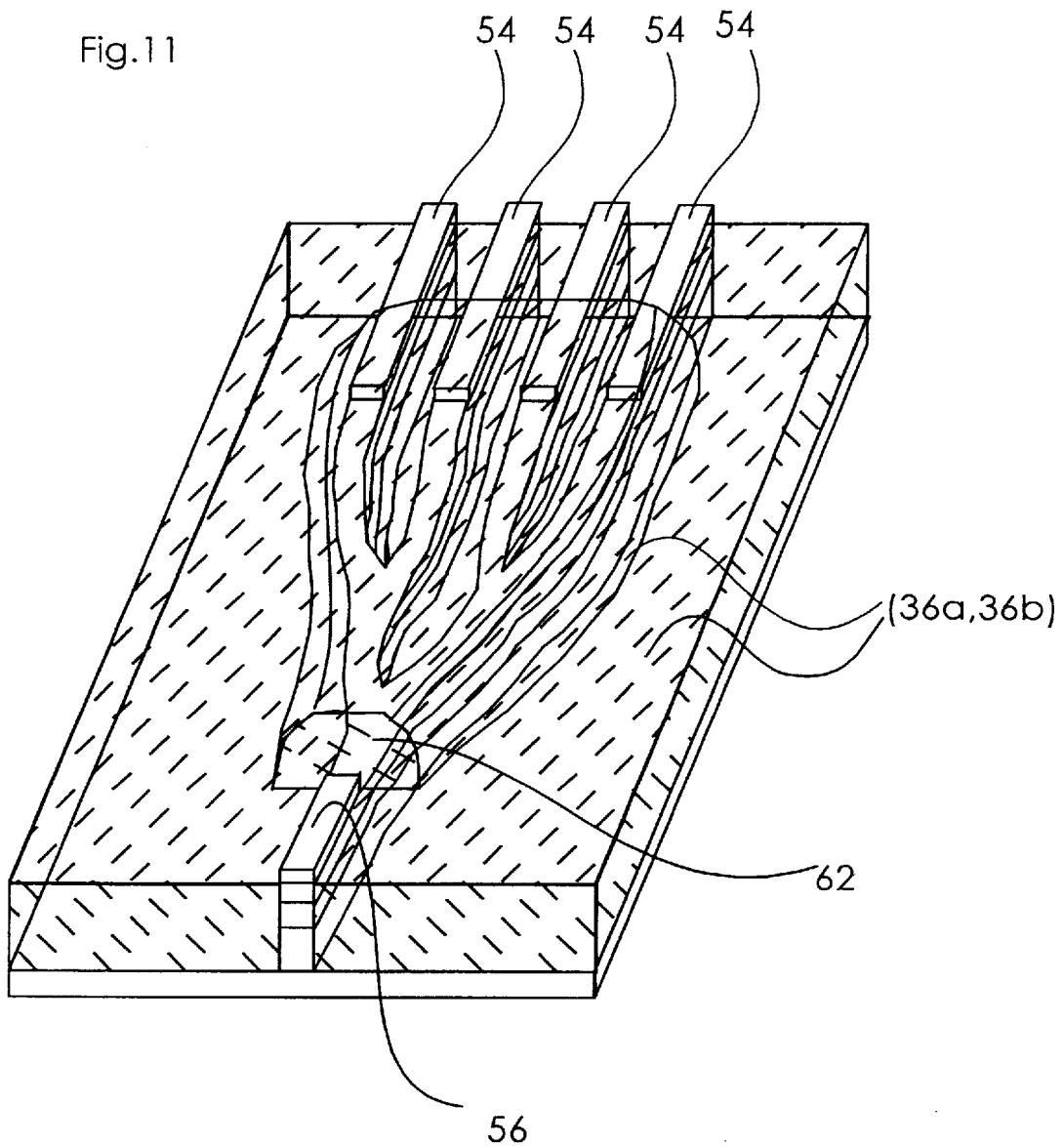
FIG. 11 is a perspective view of the second embodiment in another fabricating process.
Figure 12:
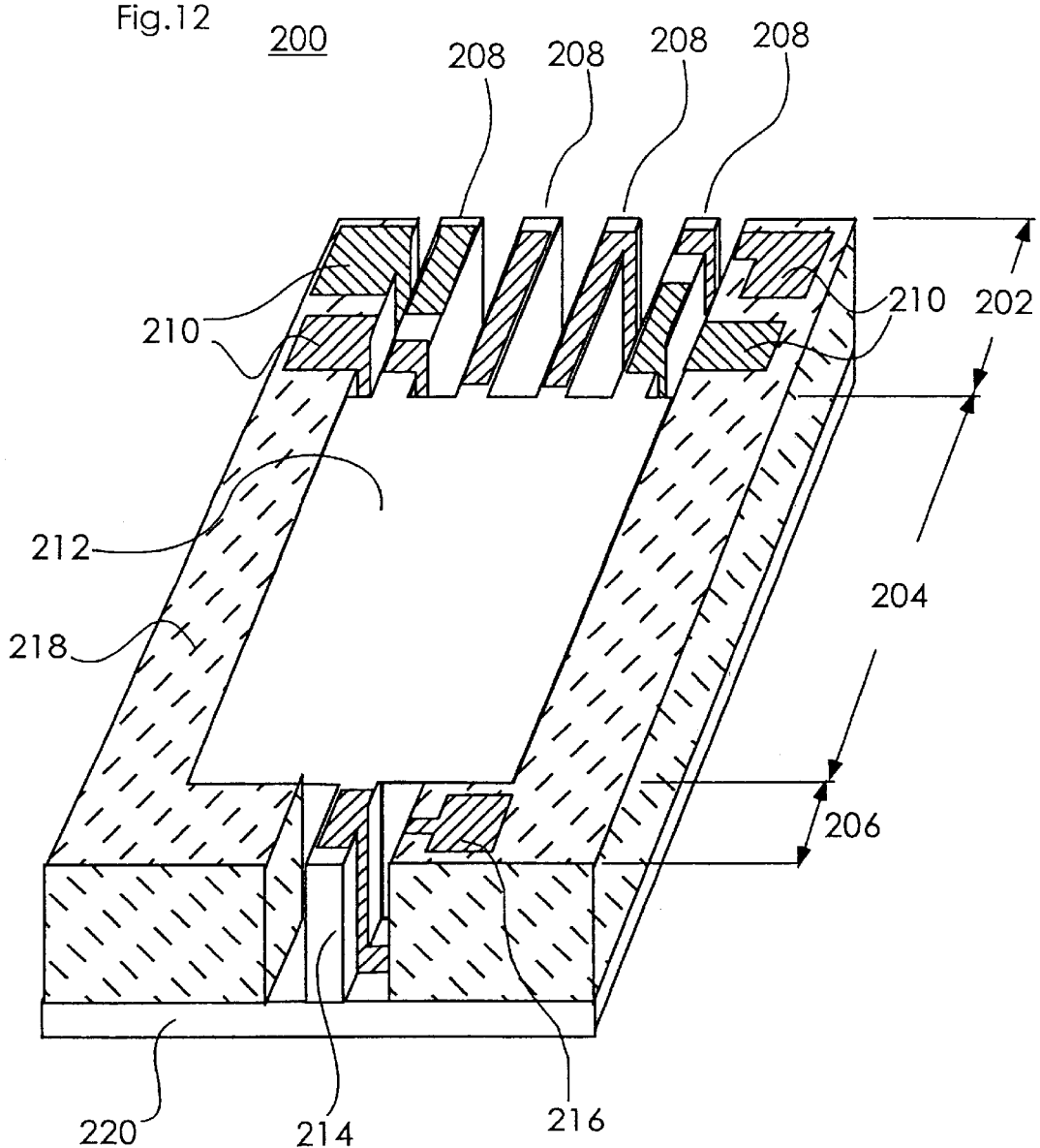
FIG. 12 is a perspective view of a conventional semiconductor laser device.
Figure 13:
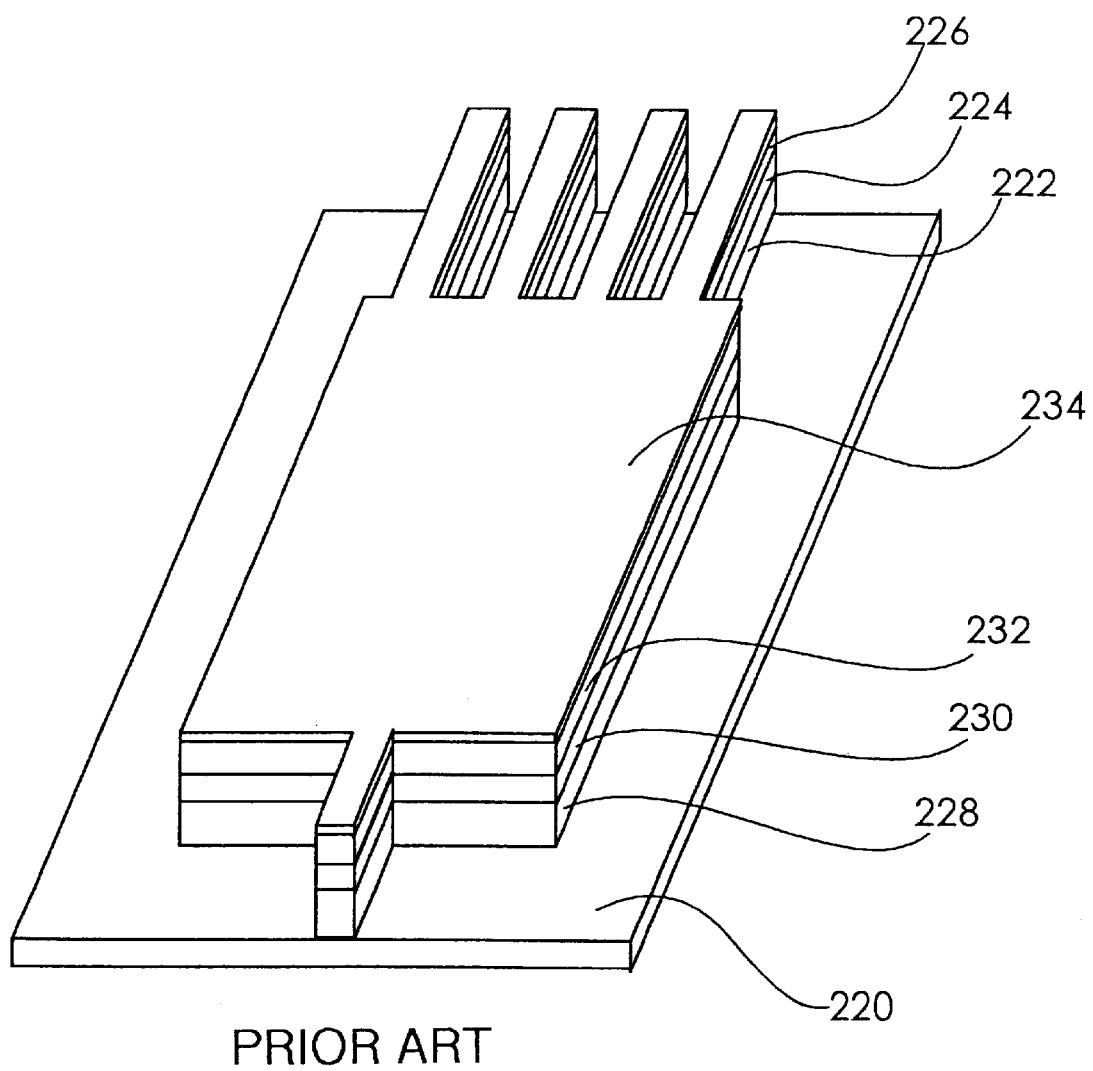
FIG. 13 is a perspective view of the conventional semiconductor laser device in one fabricating process.
Figure 14:
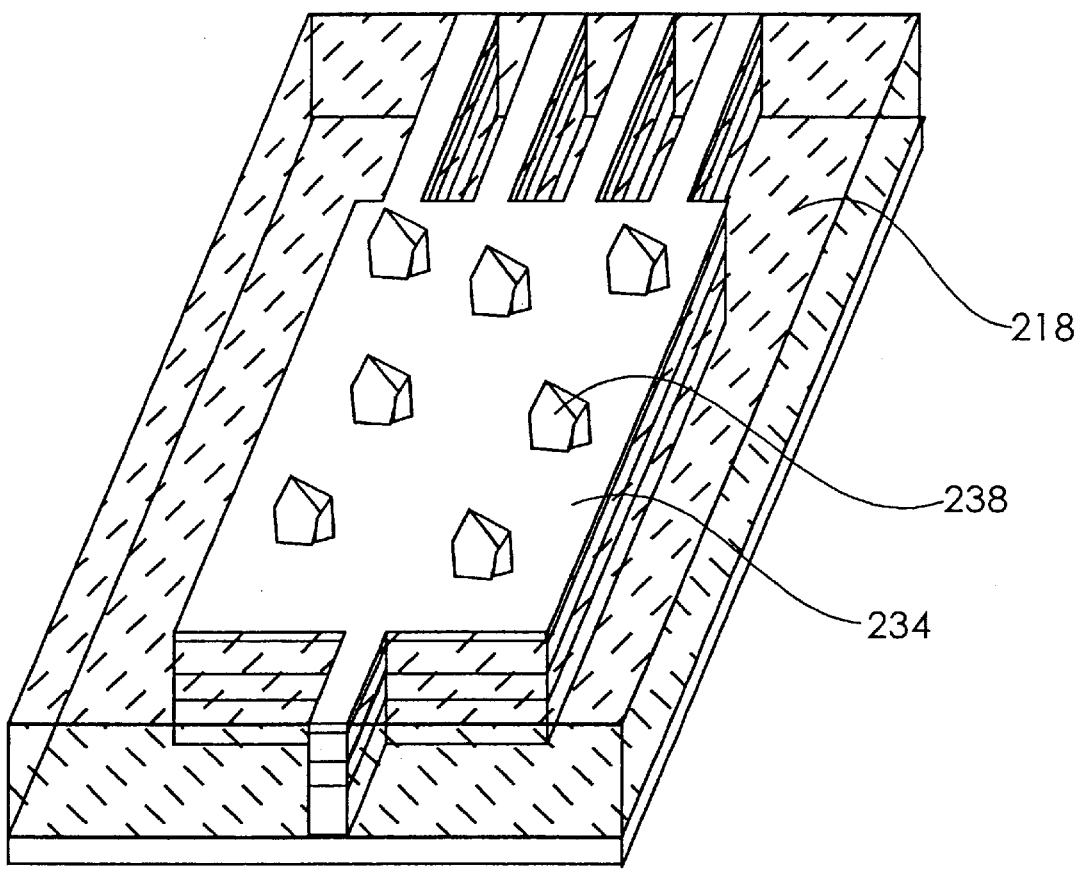
FIG. 14 is a perspective view for schematically explaining how the conventional semiconductor laser device can develop a defect attributable to the method for fabricating that device.
Figure 15:
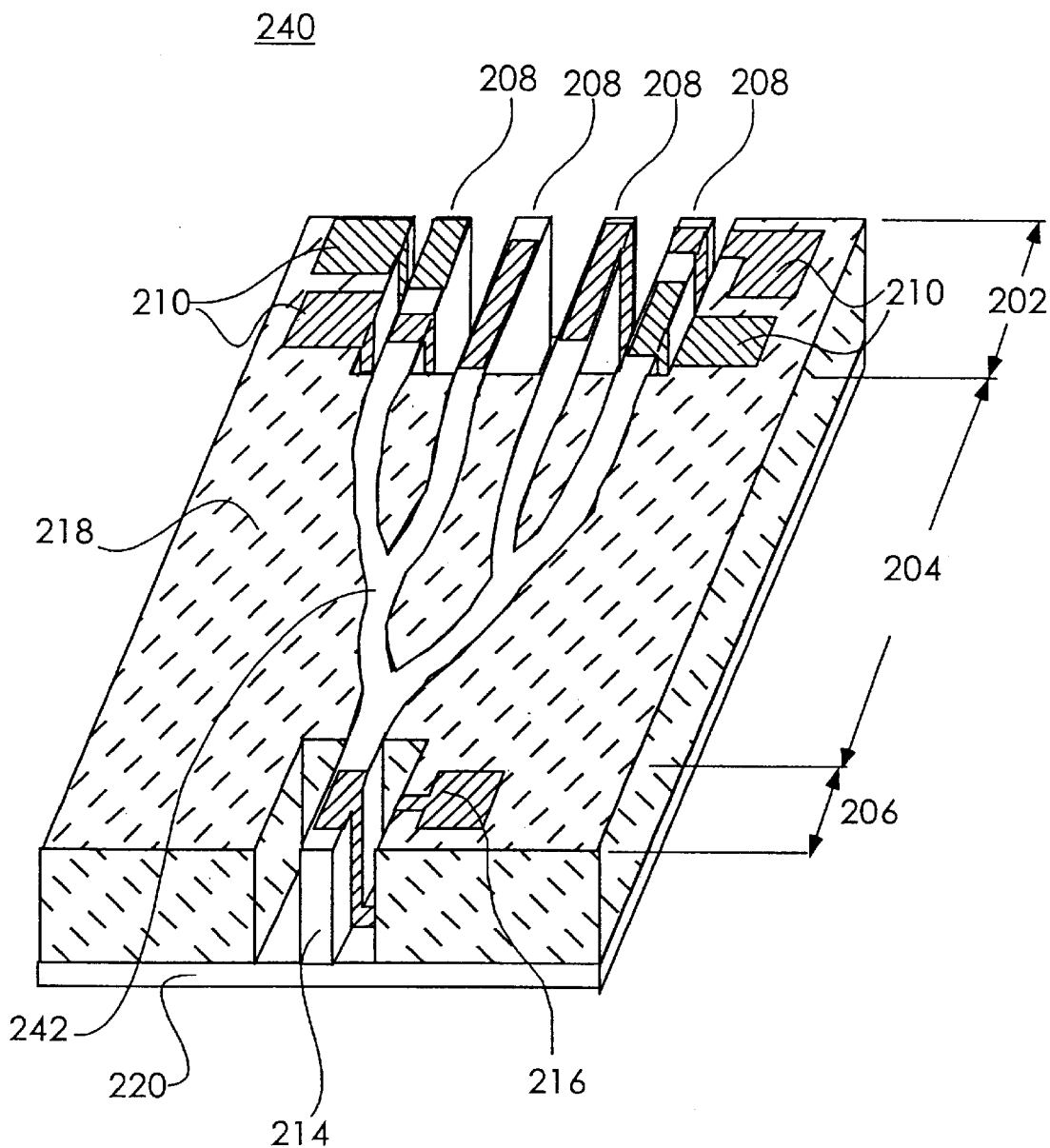
FIG. 15 is a perspective view of another conventional semiconductor laser device.
Figure 16:
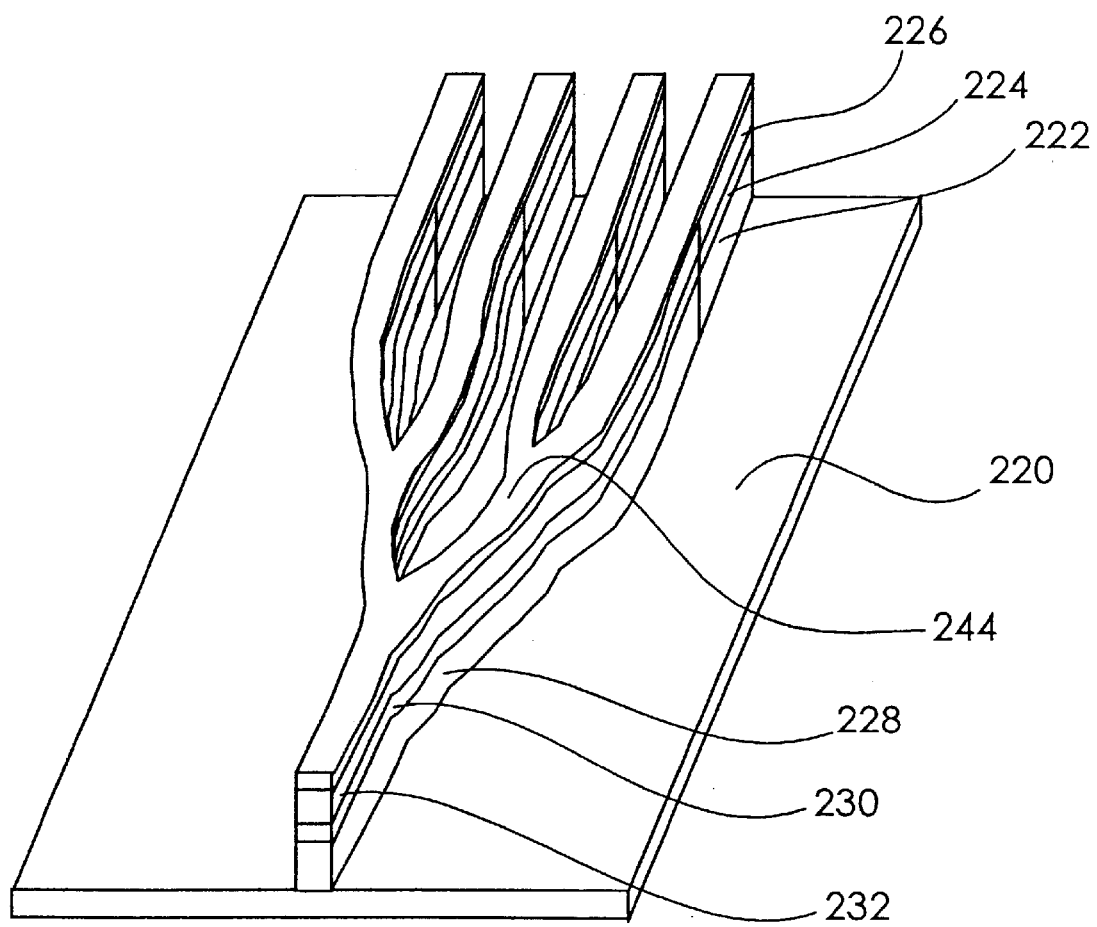
FIG. 16 is a perspective view of the conventional laser device of FIG. 15 in one fabricating process.
Figure 17:
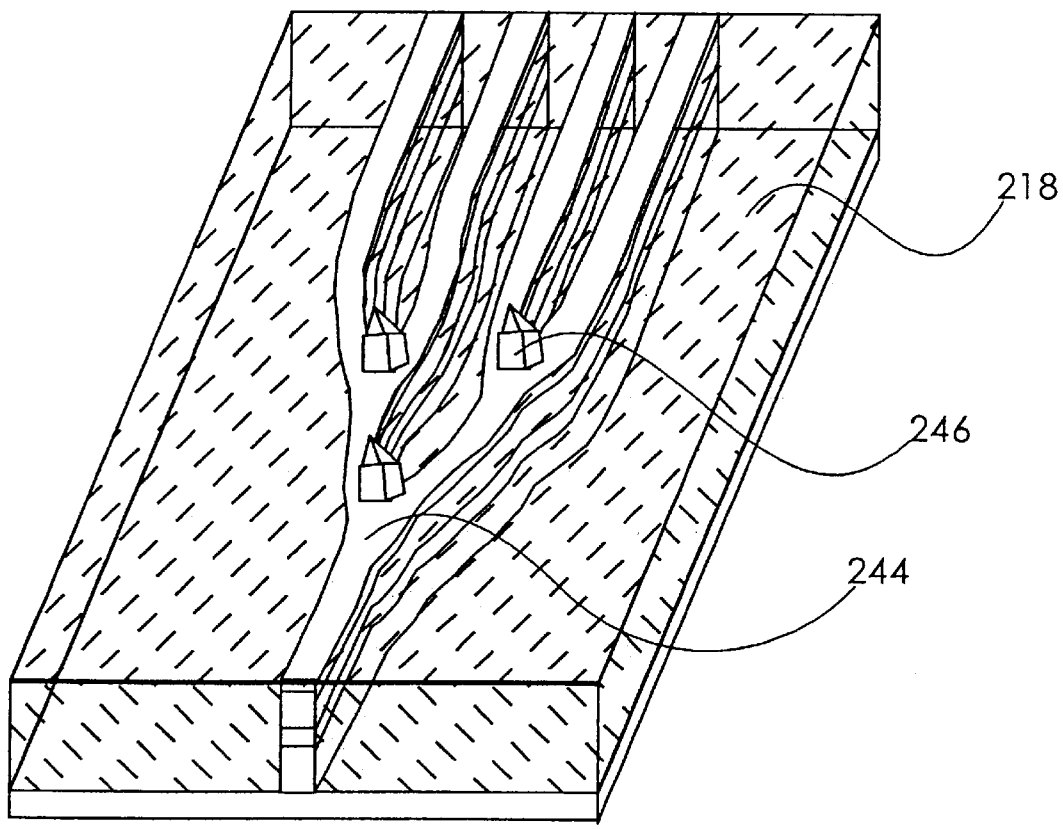
FIG. 17 is a perspective view for schematically explaining how the conventional semiconductor laser device of FIG. 15 can develop a defect attributable to the method for fabricating that device.

An inventive method for fabricating the semiconductor laser device 60 will now be described. FIGS. 10 and 11 are perspective views of the semiconductor laser device 60 in different processes of its fabrication. A layer 50 making up a laser unit 12 and a layer 52 constituting a combiner unit 14 and an output unit 16 are formed on an n-InP substrate 32 in the same manner as with the first embodiment. The outcome of this process is the same as what is shown in FIG. 5.

An insulating film is then deposited on the layered structure. A mask pattern is prepared through which to form the laser unit 12 as a band-shaped laser array 1 to 2 μm wide; the combiner unit 14 as a combination of branches which, 1 to 2 μm in width, are connected on one edge of the device to the band-shaped array of the laser unit 12 and which progressively decline in number and converge eventually on a single Y-branch at the opposite edge of the device; and the output unit 16 as a band shape 1 to 2 μm wide and connected to the end of the single Y-branch. Etching is carried out using this mask pattern as a mask until the laser active layer, the optical wave-guide layer 24a of the combiner unit 14, and the light absorption layer 44a of the output unit 16 are etched through. The process forms a ridge structure comprising a laser wave-guide ridge 34 of the laser unit 12, branching wave-guides 62, and a light modulator wave-guide ridge 44 of the output unit 16.

Later, the insulating film is removed from above the branching wave-guides 62 but insulating films 54 and 56 are left intact on the laser unit 12 and output unit 16 respectively. FIG. 10 shows the outcome of the process.

A buried growth process is then performed using the insulating film 54 on the laser unit 12 and the insulating film 56 on the output unit 16 as a mask for selective growth. Specifically, the laser wave-guide ridge 34, branching wave-guides 62, and light modulator wave-guide ridge 44 are subjected to buried growth using the insulating films 54 and 56 as the selective growth mask with the Fe-doped InP burial layer 36a and n-InP current block layer 36b deposited on the substrate 32 in that order. FIG. 11 shows the outcome of the process.

Thereafter, the second p-InP clad layer 38 and p-InGaAs contact layer 40; the insulation grooves 20 on both sides of the laser wave-guide ridge 34 and the insulation grooves 30 on both sides of the light modulator wave-guide ridge 44; the insulating film 27 all over the substrate 32; the electrodes 22 and 28; and the back surface electrodes on the polished back surface of the substrate 32 are all formed in the same manner as with the first embodiment. These processes when carried out complete the semiconductor laser device 60 as shown in FIG. 8.

When the laser wave-guide ridge 34, branching wave-guides 62, and light modulator wave-guide ridge 44 are subjected to buried growth during fabrication of the semiconductor laser device 60, the Fe-doped InP burial layer 36a and n-InP current block layer 36b are deposited on the branching wave-guides 62 because the latter have no selective growth mask. Unlike in the conventional example, however, no projections develop in the branching regions. The absence of abnormally grown projections means no broken resist films or related irregularities in subsequent processes.

Although the second p-InP clad layer 38 and contact layer 40 are not required as part of the burial semiconductor layer 25, they are left intact following the processing. Because the contact layer 40 has a high impurity density, the interposing presence of the Fe-doped InP burial layer 36a between the contact layer 40 and the branching wave-guides 62 prevents p-type Zn impurities from diffusing from the contact layer 40 into the combiner wave-guide layer 62a, whereby the transmission loss is reduced.

Following the formation of the second p-InP clad layer 38 and p-InGaAs contact layer 40, the mound-shaped portion 25a of the burial semiconductor layer 25 is left intact on the branching wave-guides 62. However, this does not cause any trouble because no electrodes are formed in the region.

As described, the processes above fabricate the semiconductor laser device 60 at low costs with high yields. Because no unstable phases are involved in its processing, the inventive method permits fabrication of a highly reliable semiconductor laser device.

Furthermore, in utilizing the etching mask as a selective growth mask for crystal growth, the inventive semiconductor laser device fabricating method simply removes the insulating film from the region over the branching waveguides 62 and thereby enhances the yield of the device.

To sum up, the above-described photonic semiconductor device according to the invention and the photonic semiconductor device fabricating method of the invention comprising the steps explained above offer the following major features and advantages:

According to one aspect of the invention, there is provided a photonic semiconductor device comprising: a laser unit made of a plurality of single wavelength semiconductor lasers each of which has a different wavelength and comprises a pair of current block structures sandwiching from both sides an optical wave-guide ridge including an active layer; an output unit having a first wave-guide layer sandwiched from above and below by a first upper clad layer and a first lower clad layer, and outputting a laser emission coming from the laser unit; a combiner unit having a second wave-guide layer sandwiched from above and below by a second upper clad layer and a second lower clad layer, and having one end connected to the laser unit and the opposite end connected to the output unit; a semiconductor substrate for carrying the laser unit, the output unit and the combiner unit; and a burial semiconductor layer of a material composition identical to that of the current block structures of the laser unit, which is disposed on the semiconductor substrate, and which covers and buries the combiner unit. The embodiment of this structure constitutes a highly reliable photonic semiconductor device fabricated at low costs with high yield rates.

In one preferred structure of the photonic semiconductor device according to the invention, the photonic semiconductor device further comprises a semiconductor layer of a high impurity density deposited on the burial semiconductor layer, and the burial semiconductor layer includes an Fe-doped InP layer. This preferred structure prevents highly concentrated impurities in the semiconductor layer from diffusing into the combiner unit by means of the Fe-doped InP layer, whereby the transmission loss is reduced. This preferred structure helps build a photonic semiconductor device permitting long-distance transmission, which makes it possible to constitute a low-cost communication network.

In another preferred structure of the photonic semiconductor device according to the invention, the combiner unit has a plan view which is rectangular in shape, and has one end where single wavelength semiconductor lasers of said laser unit are connected altogether. This preferred structure provides a highly reliable photonic semiconductor device that is fabricated at low costs with high yield rates and equipped with a multi-mode interference wave-guide.

In a further preferred structure of the photonic semiconductor device according to the invention, the combiner unit comprises a plurality of Y-branches each having a second wave-guide layer, a second upper clad layer, and a second lower clad layer, and the Y-branches have ends corresponding to single wavelength semiconductor lasers and are combined with one another in such a manner that Y-branches drop in number and eventually converge on a single Y-branch that is connected to said output unit. This preferred structure provides a highly reliable photonic semiconductor device having a branched wave-guide in its combiner unit. The device is fabricated at low costs with high yield rates.

In an even further preferred structure of the photonic semiconductor device according to the invention, the output unit may comprise either a light modulator unit including a light absorption layer or an optical amplifier. This preferred structure constitutes a highly reliable photonic semiconductor device that is fabricated at low costs with high yield rates and equipped with a light modulator unit or an optical amplifier.

According to another aspect of the invention, there is provided a photonic semiconductor device fabricating method comprising the steps of: performing a first process wherein a semiconductor layer for a semiconductor laser unit is first deposited on a semiconductor substrate; a semiconductor laser layer which is a part of the semiconductor layer is then left on the substrate by removing the rest of the semiconductor layer; a combiner unit layer having a second wave-guide layer sandwiched from above and below by a second upper clad layer and a second lower clad layer is formed connecting to the semiconductor laser layer; and an output unit layer having a first wave-guide layer sandwiched from above and below by a first upper clad layer and a first lower clad layer is formed connecting to the combiner unit layer; performing a second process wherein a dielectric film is formed over surfaces of the semiconductor laser layer, the combiner unit layer, and the output unit layer; photolithographic and etching techniques are used to form a plurality of stripe-shaped mask patterns on the semiconductor laser layer, a prescribed mask pattern on the combiner unit layer, and a stripe-shaped mask pattern on the output unit layer; and etching is carried out using the mask patterns as masks so as to form a plurality of optical wave-guide ridges of the semiconductor laser unit, a combiner unit, and an output unit ridge; and performing a third process wherein the dielectric film is removed from the combiner unit so as to have a mask pattern formed by the remaining dielectric film; and the mask pattern is used as a selective growth mask through which the combiner unit is covered with and buried by a semiconductor layer constituting current block structures of the semiconductor laser unit. In forming the combiner unit by buried growth, this fabricating method prevents polycrystals or like abnormal projections from growing so that subsequent processes are carried out with no trouble. The inventive method thus makes it possible to fabricate a highly reliable photonic semiconductor device in simplified steps with high yield rates.

In one preferred variation of the photonic semiconductor fabricating method according to the invention, the mask pattern formed on the combiner unit layer in the second process may be rectangular in shape. The preferred method makes it possible to prevent polycrystals from growing on the combiner unit while the combiner unit including a multi-mode interference wave-guide is being formed through buried growth, so that subsequent processes are carried out with no trouble. This in turn helps fabricate a highly reliable photonic semiconductor device having a multi-mode interference wave-guide arrangement in simplified steps with high yield rates.

In another preferred variation of the photonic semiconductor fabricating method according to the invention, the mask pattern formed on the combiner unit layer in the second process has Y-branches corresponding to stripe-shaped mask patterns formed on the semiconductor laser layer at one end of the mask pattern on the combiner unit layer, and the Y-branches are combined with one another in such a manner that the Y-branches drop in number and eventually converge on a single Y-branch. The preferred method makes it possible to prevent abnormal projections from growing on the combiner unit while the combiner unit including a branched wave-guide is being formed through buried growth, so that subsequent processes are carried out with no trouble. This helps fabricate a highly reliable photonic semiconductor device having a branched wave-guide arrangement in simplified steps with high yield rates.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-359193, filed on Nov. 27, 2000 including specification, claims, drawings and summary, on which the Convention priority of the present application is based, are incorporated herein by reference in its entirety.

What is claimed is:

1. A photonic semiconductor device comprising:
   a semiconductor substrate;
   a laser unit including a plurality of single wavelength semiconductor lasers, each single wavelength laser producing light of a respective and different wavelength and comprising an optical waveguide ridge including an active layer sandwiched by a pair of current blocking structures, each current blocking structure including, serially disposed with respect to said semiconductor substrate, first and second semiconductor layers;
   an output unit having a first waveguide layer, sandwiched by a first upper cladding layer and a first lower cladding layer, and outputting laser light produced by said laser unit;
   a combiner unit having a second waveguide layer sandwiched by a second upper cladding layer and a second lower cladding layer, and having a first end abutting said laser unit and a second end abutting said output unit, said semiconductor substrate carrying said laser unit, said output unit, and said combiner unit; and
   a burying semiconductor layer structure including said first and second semiconductor layers, said first semiconductor layer completely covering and burying said combiner unit and said second semiconductor layer completely covering said first semiconductor layer opposite said combiner unit.

2. The photonic semiconductor device according to claim 1, further comprising a third semiconductor layer having a high dopant impurity concentration, disposed on said burying semiconductor layer structure, wherein said first semiconductor layer is an Fe-doped InP layer.

3. The photonic semiconductor device according to claim 2, wherein said combiner unit is rectangular in a view perpendicular to a surface of said semiconductor substrate on which said laser unit, said output unit, and said combiner unit are disposed, and said first end optically connects said single wavelength semiconductor lasers of said laser unit together.

4. The photonic semiconductor device according to claim 2, wherein said combiner unit comprises a plurality of Y-branches, each Y-branch including said second waveguide layer, said second upper cladding layer, and said second lower cladding layer, and has respective ends corresponding to and abutting each of said single wavelength semiconductor lasers and combined with one another, reducing the Y-branches in number and converging to a single Y-branch connected to said output unit.

5. The photonic semiconductor device according to claim 2, wherein said output unit comprises one of a light modulator unit including a light absorption layer and an optical amplifier.

6. The photonic semiconductor device according to claim 1, wherein said combiner unit is rectangular in a view perpendicular to a surface of said semiconductor substrate on which said laser unit, said output unit, and said combiner unit are disposed, and said first end optically connects said single wavelength semiconductor lasers of said laser unit together.

7. The photonic semiconductor device according to claim 3, wherein said output unit comprises one of a light modulator unit including a light absorption layer and an optical amplifier.

8. The photonic semiconductor device according to claim 1, wherein said combiner unit comprises a plurality of Y-branches, each Y-branch including said second waveguide layer, said second upper cladding layer, and said second lower cladding layer, and has respective ends corresponding to and abutting each of said single wavelength semiconductor lasers and combined with one another, reducing the Y-branches in number and converging to a single Y-branch connected to said output unit.

9. The photonic semiconductor device according to claim 8, wherein said output unit comprises one of a light modulator unit including a light absorption layer and an optical amplifier.

10. The photonic semiconductor device according to claim 1, wherein said output unit comprises one of a light modulator unit including a light absorption layer and an optical amplifier.

* * * * *